United States Patent [19]

Prabhu et al.

[11] Patent Number: 4,808,770

[45] Date of Patent: Feb. 28, 1989

[54] THICK-FILM COPPER CONDUCTOR INKS

[75] Inventors: Ashok N. Prabhu, East Windsor Township, Mercer County; Kenneth W. Hang, West Windsor Township, Mercer County; Edward J. Conlon, Princeton Township, Mercer County, all of N.J.

[73] Assignee: General Electric Company, Schenectady, N.Y.

[21] Appl. No.: 87,583

[22] Filed: Aug. 20, 1987

Related U.S. Application Data

[63] Continuation-in-part of Ser. No. 914,303, Oct. 2, 1986, abandoned.

[51] Int. Cl.$^4$ .......................... H05K 1/00; H01B 1/06
[52] U.S. Cl. .................................. 174/68.5; 361/305; 361/411; 501/19; 501/73; 501/79; 501/69; 501/70; 106/1.13; 106/1.18; 252/512; 252/518; 252/521; 252/520
[58] Field of Search .............. 252/512, 520, 518, 521; 361/305, 411; 174/68.5; 501/19, 20, 21, 26, 55, 63, 68, 69, 70, 79; 106/1.13, 1.18

[56] References Cited

U.S. PATENT DOCUMENTS

| | | | |
|---|---|---|---|
| 3,022,179 | 2/1962 | Morrissey | 106/39 |
| 3,501,322 | 3/1970 | Dumbaugh, Jr. et al. | 106/48 |
| 3,876,407 | 4/1975 | Hirose et al. | 65/30 |
| 4,049,872 | 9/1977 | Hang | 428/427 |
| 4,061,584 | 12/1977 | Girard et al. | 252/63 |
| 4,256,796 | 3/1981 | Hang et al. | 428/210 |
| 4,355,114 | 10/1982 | Hang et al. | 501/5 |
| 4,355,115 | 10/1982 | Hang et al. | 501/21 |
| 4,369,220 | 1/1983 | Prabhu et al. | 428/209 |
| 4,369,254 | 1/1983 | Prabhu et al. | 501/21 |
| 4,376,725 | 3/1983 | Prabhu et al. | 252/512 |
| 4,377,642 | 3/1983 | Prabhu et al. | 501/20 |
| 4,385,127 | 5/1983 | Chyung | 501/5 |
| 4,399,320 | 8/1983 | Prabhu et al. | 174/68.5 |
| 4,400,214 | 8/1983 | Ogawa et al. | 106/1.13 |
| 4,401,709 | 8/1983 | Prabhu et al. | 428/209 |
| 4,415,624 | 11/1983 | Prabhu et al. | 428/209 |
| 4,514,321 | 4/1985 | Siuta | 252/512 |
| 4,521,329 | 6/1985 | Siuta et al. | 252/512 |
| 4,536,535 | 8/1985 | Usala | 524/403 |
| 4,540,604 | 9/1985 | Siuta | 427/96 |
| 4,619,836 | 10/1986 | Prabhu et al. | 427/41 |
| 4,623,482 | 11/1986 | Kuo et al. | 252/512 |

FOREIGN PATENT DOCUMENTS

0084936 8/1983 European Pat. Off. .
174544 10/1984 Japan .

*Primary Examiner*—Josephine Barr
*Attorney, Agent, or Firm*—James Magee, Jr.; James C. Davis, Jr.

[57] ABSTRACT

Improved copper conductor inks useful in fabricating multilevel circuits are provided. The inks comprise copper powder, a devitrifying glass frit which does not begin to flow until the furnace temperature is above about 700° C., and a suitable organic vehicle. Devitrifying glass frits with these properties include a zinc-calcium-aluminum-silicate glass frit, a zinc-magnesium-barium-aluminum-silicate glass frit, a zinc-magnesium-barium-aluminum-zirconium-phosphosilicate glass frit and mixtures thereof. The inks are advantageous in that they form copper conductor layers having excellent properties without the inclusion of traditional flux materials such as bismuth oxide.

6 Claims, No Drawings

THICK-FILM COPPER CONDUCTOR INKS

This application is a continuation-in-part of U.S. patent application Ser. No. 914,303, filed Oct. 2, 1986 now abandoned.

This invention relates to thick-film copper conductor inks and their use in fabricating multilayer electrical circuit structures.

BACKGROUND OF THE INVENTION

The use of specialized ink formulations to form thick films having various functions on suitable substrates in the construction of multilayer integrated circuits is known in the art. Such technology is of increasing interest in the production of very dense multilayer circuit patterns on various substrates for a wide variety of applications in the electronics industry.

Thick-film multilayer structures based on copper conductors typically are comprised of at least two patterned layers of copper conductor separated by a dielectric layer. The patterned conductor layers are connected by copper deposited in vias in the dielectric layer. Such structures are formed by multiple deposition and firing of layers of copper and dielectric inks.

Such multilayer circuit structures utilizing copper as the conductor metal have a number of problems. The most common is failure caused by the development of electrical shorts due to interactions between flux materials of the copper conductor ink and the dielectric layer which take place during the multiple firings necessary to fabricate a multilayer integrated circuit. The responsible materials present in conventional copper conductor inks include copper oxide which forms upon exposure of the ink to air or an oxidizing atmosphere and flux materials such as lead oxide and bismuth oxide. These materials will penetrate a porous dielectric material, particularly if it contains large modifier ions such as lead, barium and bismuth. The penetration of such materials is enhanced by the fact that the multiple firing steps are conventionally carried out at temperatures well above the temperature at which copper oxide forms an eutectic mixture with lead or bismuth oxides.

A second problem common to both dielectric and copper conductor inks is the entrapment of gaseous materials formed during repeated firings as a result of incomplete removal of the carbonaceous residue of the organic vehicle present in conventional ink formulations. The escaping gaseous material can cause blistering and peeling of the thick films formed from the inks during subsequent firings and is also responsible for the porosity of dielectric films.

An approach to reducing the incidence of electrical shorts from these problems is to formulate dielectric inks which form thick films having reduced porosity.

A second approach is to treat functional inks, e.g. dielectric and copper conductor inks, with an oxidizing or reducing plasma prior to firing as disclosed by Prabhu et al. in U.S. Pat. No. 4,619,836, issued Oct. 28, 1986. The plasma treatment removes the carbonaceous residue of the organic vehicle present in conventional ink formulations.

A third possibility is the formulation of improved copper conductor inks. Such improved inks are provided in accordance with this invention.

SUMMARY OF THE INVENTION

The improved copper conductor inks of the present invention comprise copper powder, an organic vehicle and a devitrifying glass frit which does not begin to flow until the furnace temperature is above about 700° C. Devitrifying glass frits having these properties include a zinc-calcium-aluminum-silicate glass frit, a sinc-magnesium-barium-aluminum-zirconium-phosphosilicate glass frit, a zinc-magnesium-barium-aluminum-silicate glass frit and mixtures thereof. The subject inks are formulated without bismuth oxide, thereby virtually eliminating the formation of eutectic phases with copper oxide which readily penetrate into dielectric materials. The subject inks are utilized in the fabrication of multilayer integrated circuit structures.

DETAILED DESCRIPTION OF THE INVENTION

The copper powder utilized in the subject conductive inks is pure copper having a particle size of from about 1 to 5 micrometers. The copper comprises from about 65 to about 85, preferably from about 75 to about 80, percent by weight of the subject ink compositions.

The devitrifying glass frits utilized in the conductive inks of the present invention do not begin to flow until the furnace temperature is above about 700° C. Suitable devitrifying glass frits having these properties include a zinc-calcium-aluminum-silicate glass frit, a zinc-magnesium-barium-aluminum-zirconium-phosphosilicate glass frit, a zinc-magnesium-barium-aluminum-silicate glass frit and mixtures thereof. The devitrifying glass frits may be utilized individually or combined in any proportion and comprise from about 5 to about 15, preferably from about 6 to about 9, percent by weight of the subject inks.

The zinc-calcium-aluminum-silicate glass frit of the novel inks of this invention is disclosed in a dielectric ink in copending Hang et al. U.S. patent application Ser. No. 914,301, entitled "DIELECTRIC INKS FOR MULTILAYER COPPER CIRCUITS", filed on Oct. 2, 1986, and comprises, on a weight basis:

(a) from about 7 to 12, preferably from about 8 to about 10, percent of zinc oxide;

(b) from about 25 to 45, preferably from about 29 to about 38, percent of calcium oxide;

(c) from about 10 to 20, preferably from about 11 to about 18.5, percent of aluminum oxide;

(d) from about 35 to 50, preferably from about 37 to about 44, percent of silicon dioxide;

(e) from 0 to about 2, preferably from about 0.5 to about 1, percent of phosphorus pentoxide; and (f) from 0 to about 5, preferably from about 2 to about 3, percent of zirconium silicate.

The zinc-magnesium-barium-aluminum-zirconium-phosphosilicate glass frit of the inks of this invention is disclosed in a dielectric ink in copending U.S. patent application Ser. No. 914,302 of Hang et al. entitled "DIELECTRIC INKS FOR MULTILAYER COPPER CIRCUITS", filed on Oct. 2, 1986. This frit comprises, on a weight basis:

(a) from about 15 to about 25, preferably from about 16 to about 22, percent of zinc oxide;

(b) from about 10 to about 25, preferably from about 16 to about 22, percent of magnesium oxide;

(c) from about 3 to about 12, preferably from about 5 to 10, percent of barium oxide;

(d) from about 5 to about 20, preferably from about 8 to about 11, percent of aluminum oxide;
(e) from about 35 to about 50, preferably from about 39 to about 43, percent of silicon dioxide;
(f) from about 0.5 to about 3, preferably from about 1 to about 2, percent of phosphorus pentoxide; and
(g) from about 1 to about 5, preferably from about 2 to about 3, percent of zirconium silicate.

In order to have a wider range of control of the crystallization rate of the zinc-magnesium-barium-aluminum-zirconium-phosphosilicate glass frit, the lower weight percentage limits of both phosphorus pentoxide and zirconium silicate may be lowered to include zero. Thus, the inks of this invention also include a devitrifying zinc-magnesium-barium-aluminumsilicate glass frit. This frit comprises, on a weight basis:
(a) from about 15 to about 25, preferably from about 16 to about 22, percent of zinc oxide;
(b) from about 10 to about 25, preferably from about 16 to about 22, percent magnesium oxide;
(c) from about 3 to about 12, preferably from about 5 to about 10, precent of barium oxide;
(d) from about 5 to about 20, preferably from about 8 to about 11, percent of aluminum oxide;
(e) from about 35 to about 50, preferably from about 39 to about 43, percent of silicon dioxide;
(f) from 0 to about 3 percent of phosphorus pentoxide; and
(g) from 0 to about 5 percent of zirconium silicate.

When it is desirable to moderate the flow of the copper ink during firing, by increasing the crystallization rate of the glass frit, from 0 to about 0.5 weight percent of phosphorus pentoxide and from 0 to about 1 weight percent of zirconium silicate should be used.

The devitrifying glass frits of the subject copper conductor inks are particularly advantageous in that they have a very high softening temperature, i.e. they do not begin to flow until the furnace temperature is above 700° C. Since the dried ink layers remain permeable to the passage of gaseous materials until they begin to significantly flow and densify, the subject frits provide substantial extra time in the furnace where furnace gases may penetrate the frit and remove the last carbonaceous residues of the binder. Because the high softening temperature of the glass frit provides efficient removal of carbonaceous residues from the dried ink, it is not necessary to treat the subject inks before firing in an oxidizing or reducing plasma as described in the above-mentioned Prabhu et al. U.S. Pat. No. 4,619,836.

A second and unexpected advantage of the devitrifying glass frits of the subject inks is that they can be formulated into a copper conductor ink having excellent properties without the inclusion of traditional flux materials such as lead oxide and, particularly, bismuth oxide.

A further advantage of the zinc-calcium-aluminum-silicate glass frit of this invention is that it has an expansion coefficient close to that of conventional alumina circuit boards in both the vitreous and devitrified states. This is an important departure from the glass frits contained in most conventional inks which have a marked difference in expansion between their vitreous and devitrified states. This is an advantage since this frit is slow to crystallize.

The zinc-magnesium-barium-aluminum-zirconium-phosphosilicate glass frit of the subject inks does not possess a similar coefficient of expansion in the vitreous and devitrified states. However, since it completes its crystallization very rapidly, i.e. within a single firing cycle, the effect is the same, i.e. neither glass frit undergoes significant changes in expansion from layer to layer during multiple firings.

The organic vehicles are solutions of resin binders such as, for example, cellulose derivatives, particularly ethyl cellulose, synthetic resins such as polyacrylates, polymethacrylates, polyesters, polyolefins and the like in a suitable solvent. A preferred binder is poly(isobutylmethacrylate). In general, conventional solvents utilized in inks of the type described herein may be used. Preferred commercially available solvents include, for example, pine oil, terpineol, butyl carbitol acetate, 2,2,4-trimethyl-1,3-pentanediol monoisobutyrate, available from Texas Eastman Company under the trademark Texanol and the like. The vehicles suitably contain from about 5 to about 25 percent by weight of the resin binder. However, it may be necessary to add more solvent to the organic vehicle to adjust the ink rheology. Thus, the organic vehicle may contain from about 2 to about 25 percent by weight of the resin binder.

The above resin binders may be utilized individually or in any combination of two or more. A suitable viscosity modifier can be added to the resin material if desired. Such a modifier can be, for example, a castor oil derivative available from N.L. Industries under the trademark Thixatrol.

The vehicles of the subject inks may also contain up to about 25, preferably from about 10 to about 20, percent by weight, based on the vehicle, of a suitable wetting agent of the type conventionally used in copper conductor inks to aid in coating the particles of copper powder with the organic vehicle. As is the case with all components of the organic vehicle, the wetting agent must fire cleanly in nitrogen, i.e., without leaving a carbonaceous residue. A preferred wetting agent is a dispersion of a complex multifunctional, aliphatic hydrocarbon in an aliphatic hydrocarbon oil available under the trademark Hypothiolate 100 from Central Compounding Company, Chicago, Illinois. The vehicles also suitably contain from about 0.5 to about 10, preferably from about 1 to about 3, percent by weight of a surfactant such as oleylamine, available as Armeen O, or a high molecular weight N-alkyl-1,3-diaminopropane dioleate, available as Duomeen TDO, both from AKZO Chemie America. The organic vehicle comprises from about 5 to about 25 percent preferably from about 12 to about 16 percent, by weight, or the subject inks. Regardless of the vehicle utilized, it is important that the homogeneity of the ink be maximized. Therefore, mixing is suitably carried out in a conventional apparatus which mixes in combination with subjecting the dispersion to high shearing action.

The improved copper conductor inks of this invention are applied to the substrate structures by conventional means, e.g. screen printing, brushing, spraying and the like, with screen printing being preferred. The coating of ink is dried in air at 100°–125° C. for about 15 minutes. The resulting film is then fired in nitrogen at 850° to 950° C. for from 4 to 10 minutes to form copper conductors comprising from about 70 to about 95 percent by weight of the copper powder and from about 5 to about 30 percent by weight of the glass frit. The subject inks are most suitably utilized for buried layers of copper conductor in a multilayer circuit in view of their compatibility with conventional boards and the improved dielectric inks described herein. It is preferred in accordance with this invention that a precoating of dielectric material be deposited over a substrate, e.g. a conventional alumina substrate, before the initial layer of the subject copper conductor is printed thereon.

Although the subject conductor inks adhere well to conventional alumina circuit boards, the use of a dielectric precoat is considered beneficial in that it enhances adherance of the subject conductor and virtually eliminates the possibility of separation from the substrate during subsequent firings. In general, a thin coating of dielectric material, i.e. from about 10 to 20 micrometers, is contemplated herein. Suitably, such a coating is uniformly deposited on the substrate as an initial step in the formulation of multilayer circuits. Although the choice of a dielectric material is not particularly critical, other than a requirement that it have an expansion coefficient close to that of the circuit board, it is preferred that a dielectric ink be utilized that is based on the glass frits of the subject copper conductor ink. Such inks are disclosed in the aforementioned Hang et al. U.S. patent application Ser. Nos. 914,301 and 914,302. Such dielectric inks generally comprise from about 50 to about 75 percent by weight of the glass frit, up to about 30 percent by weight of a suitable ceramic filler and from about 15 to about 30 percent by weight of a suitable organic vehicle. Suitable ceramic fillers include alumina powder ($Al_2O_3$), barium dimagnesium disilicate ($BaMg_2Si_2O_7$), dimagnesium borate ($Mg_2B_2O_5$), zirconium silicate ($ZrSiO_4$), dimagnesia silicate ($2MgO \cdot SiO_2$), dimagnesia dialumina pentasilicate ($2MgO \cdot 2Al_2O_3 \cdot 5SiO_2$) and mixtures thereof.

Copper conductor layers formed from the inks of this invention are advantageous in that they demonstrate good conductivity and resistance to oxidation. In addition, copper conductor layers formed from the inks of this invention possess excellent compatibility with improved dielectric materials such as those described in the aforementioned Hang et al. applications.

The following Examples further illustrate this invention, it being understood that the invention is in no way intended to be limited to the details described therein. In the Examples, all parts and percentages are on a weight basis and all temperatures are in degrees Celsius, unless otherwise stated.

EXAMPLE 1

A copper conductor ink was prepared by mixing 76.9 parts of copper powder having an average particle size of 3 micrometers and 7.7 parts of a devitrifying glass frit comprising: 9.09 percent of zinc oxide, 30.40 percent of calcium oxide, 18.28 percent of aluminum oxide and 42.23 percent of silicon dioxide. The solid ingredients were mixed with 15.4 parts of an organic vehicle consisting of a 6 percent solution of ethyl cellulose in Texanol, additionally containing the wetting agents Hypothiolate 100 and Armeen O in concentrations of 17 percent and 3 percent, respectively, based on the vehicle. The ink was initially hand-mized and then mixed on a three-roll mill to obtain a paste suitable for screen printing. Additional solvent was added as necessary to assure proper rheology.

A conventional alumina board was initially coated with a 15 micrometer thick layer of dielectric material by printing and firing a dielectric ink. The dielectric ink was comprised of 57.4 parts of the above-described glass frit, 8.6 parts of alumina having a particle size of 3 micrometers, 10.5 parts of barium dimagnesium disilicate having a particle size of 3-5 micrometers and 23.5 parts of a vehicle comprising a 20 percent solution of poly(isobutylmethacrylate) in Texanol also containing one percent of Duomeen TDO based on the vehicle. The copper ink was printed onto the fired dielectric material, dried in air at 125° for 15 minutes and fired in nitrogen at 900° for 10 minutes to form a layer 12.5 micrometers thick. The sequential printing and firing of dielectric and copper inks was repeated twice more to produce a multilayer structure having three buried layers of copper conductor. For each dielectric isolation layer, three separate printings and firings of the dielectric ink were carried out. It was found by biasing pairs of the copper conductor layers that no contact had been made through any of the dielectric material. Microscopic examination showed no evidence of blistering or separation of the copper conductor from the dielectric material and substantially no evidence of copper penetration into the dielectric material.

EXAMPLE 2

The procedure of Example 1 was repeated utilizing in the copper conductor a glass frit comprised of 21.81 percent of zinc oxide, 19.25 percent of magnesium oxide, 5.88 percent of barium oxide, 9.38 percent of aluminum oxide, 39.68 percent of silicon dioxide, 2.00 percent of phosphorus pentoxide and 2.00 percent of zirconium silicate.

The dielectric ink was comprised of 67.7 percent of the above glass frit, 5.8 percent of alumina, 3.9 percent of barium dimagnesium disilicate and 22.6 percent of the organic vehicle utilized to prepare the dielectric ink of Example 1.

Biasing a multilayer structure prepared as in Example 1 showed no evidence of blistering or separation of the copper conductor and no discernible penetration of components of the copper ink into the dielectric material.

EXAMPLE 3

A conventional alumina board was initially coated with a thin layer of dielectric material as in Example 1. The copper conductor ink of Example 1 was printed thereover to form a series of isolated parallel lines 375 micrometers wide separated by spaces of equal width. The copper ink was dried in air at 125° for 15 minutes and fired in nitrogen at 900° for 10 minutes. The dielectric ink of Example 1 was printed, dried and fired thereover. Openings or vias were left in the dielectric layer overlying a portion of the copper conductor.

A copper via-fill ink was prepared as follows: a devitrifying glass frit consisting of: 21.8 percent of zinc oxide; 16.5 percent of magnesium oxide; 7.8 percent of barium oxide; 39.2 percent of silicon dioxide; 10.7 percent of aluminum oxide; 1.0 percent of phosphorus pentoxide; and 3.0 percent of zirconium silicate and a vitreous glass frit consisting of: 51.59 percent of barium oxide, 12.58 percent of calcium oxide; 15.62 percent of boron trioxide; and 20.21 percent of silicon dioxide were separately prepared and reduced to a particle size of about three micrometers. Solid ingredients consisting of 65 percent of copper powder having an average particle size of three micrometers, 14 percent of the devitrifying glass frit and 4 percent of the vitreous glass frit were thoroughly mixed by hand.

The solid ingredients were mixed with 17 parts of an organic vehicle consisting of a 20 percent solution of poly(isobutylmethacrylate) in Texanol additionally containing, as wetting agents, 17 percent of Hypothiolate, 100 and 3 percent of Armeen O. The ink was initially hand-mixed and then mixed on a three-roll mill to obtain a paste suitable for screen printing. Additional solvent was added as necessary to assure proper rheology. The via-fill ink is described in copending U.S. patent application Ser. No. 914,296 of Prabhu et al. entitled "THICK-FILM COPPER VIA-FILL INKS", filed Oct. 2, 1986.

The via-fill ink was printed into the spaces in the dielectric ink, dried in air at 125° for 15 minutes and fired in nitrogen at 900° for 10 minutes. The thickness of the dielectric/copper via-fill was 15 micrometers. The dielectric/copper via-fill depositions were repeated three times to form a final thickness of 45 micrometers. A layer of the copper conductor ink of Example 1 was deposited and fired over the structure so that a portion was in contact with the copper via-fill. This procedure was repeated three times to obtain a multilayer copper-based device having four buried layers. In total, 25 firings were required to complete the multilayer circuit.

The structure was biased through electrical contacts made to the copper layers. No evidence of shorting or loss of contact was observed in any of the copper layers.

EXAMPLE 4

Example 3 was repeated utilizing the copper conductor ink and dielectric ink described in Example 2. Biasing of the resulting multilayer circuit structure produced results comparable to those obtained in Example 3.

We claim:

1. A multilayer, copper-based integrated circuit structure comprising a circuit board having thereon at least two patterned layers of copper conductor separated by a dielectric layer having vias filled with copper contacting said copper conductor layers, said copper conductors comprising from about 70 to about 95 weight percent copper powder and from about 5 to about 30 weight percent glass frit selected from the group consisting of zinc-calcium-aluminum silicate glasses and zinc-magnesium-barium-aluminum-zirconium-phosphosilicate glasses which do not flow at temperatures below about 700° C.

2. A multilayer, copper-based integrated circuit structure according to claim 1 comprising a suitable circuit board having thereon at least two patterned layers of a copper conductor, said layers being separated by a dielectric layer having vias therein, said vias being filled with copper to contact said conductor layers, the copper conductors comprising on a weight basis,
   (a) from about 70 to about 95 percent of copper powder; and
   (b) from about 5 to about 30 percent of a devitrifying glass frit comprising on a weight basis:
   (c) from about 15 to about 25 percent of zinc oxide;
   (d) from about 10 to about 25 percent of magnesium oxide;
   (e) from about 3 to about 12 percent of barium oxide;
   (f) from about 5 to about 20 percent of aluminum oxide;
   (g) from about 35 to about 50 percent of silicon dioxide;
   (h) from 0 to about 3 percent of phosphorus pentoxide; and
   (i) from 0 to about 5 percent of zirconium silicate.

3. A circuit structure in accordance with claim 1, wherein the devitrifying glass frit is a zinc-magnesium-barium-aluminum-silicate glass comprising, on a weight basis:
   (a) from about 15 to about 25 percent of zinc oxide;
   (b) from about 10 to about 25 percent of magnesium oxide;
   (c) from about 3 to about 12 percent of barium oxide;
   (d) from about 5 to about 20 percent of aluminum oxide;
   (e) from about 35 to about 50 percent of silicon dioxide;
   (f) from 0 to about 0.5 percent of phosphorus pentoxide; and
   (g) from 0 to about 1 percent of zirconium silicate.

4. In a multilayer, copper-based integrated circuit structure comprising a suitable circuit board having th thereon at least two patterned layers of a copper conductor, said layers being separated by a dielectric layer having vias therein, said vias being filled with copper to contact said conductor layers, the improvement wherein the copper conductors comprise on a weight basis:
   (a) from about 70 to about 95 percent of copper powder; and
   (b) from about 5 to about 30 percent of a devitrifying glass frit selected from the group consisting of a zinc-calcium-aluminum-silicate glass frit, a zinc-magnesium-barium-aluminum-zirconium-phosphosilicate glass frit and mixtures thereof.

5. A circuit structure in accordance with claim 1, wherein the devitrifying glass frit is a zinc-calcium-aluminum-silicate glass frit comprising, on a weight basis:
   (a) from about 7 to about 12 percent of zinc oxide;
   (b) from about 25 to about 45 percent of calcium oxide;
   (c) from about 10 to about 20 percent of aluminum oxide;
   (d) from about 35 to about 50 percent of silicon dioxide;
   (e) from 0 to about 2 percent of phosphorus pentoxide; and
   (f) from 0 to about 5 percent of zirconium silicate.

6. A circuit structure in accordance with claim 1 wherein the devitrifying glass frit is a zinc-magnesium-barium-aluminum-zirconium-phosphosilicate glass comprising, on a weight basis:
   (a) from about 15 to about 25 percent of zinc oxide;
   (b) from about 10 to about 25 percent of magnesium oxide;
   (c) from about 3 to about 12 percent of barium oxide;
   (d) from about 5 to about 20 percent of aluminum oxide;
   (e) from about 35 to about 50 percent of silicon dioxide;
   (f) from about 0.5 to about 3 percent of phosphorus pentoxide; and
   (g) from about 1 to about 5 percent of zirconium silicate.

* * * * *